United States Patent
Shaviv et al.

(10) Patent No.: US 11,024,537 B2
(45) Date of Patent: Jun. 1, 2021

(54) METHODS AND APPARATUS FOR HYBRID FEATURE METALLIZATION

(71) Applicant: APPLIED MATERIALS, INC., Santa Clara, CA (US)

(72) Inventors: Roey Shaviv, Palo Alto, CA (US); Ismail Emesh, Sunnyvale, CA (US); Xikun Wang, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 76 days.

(21) Appl. No.: 16/598,878

(22) Filed: Oct. 10, 2019

(65) Prior Publication Data

US 2021/0043506 A1 Feb. 11, 2021

Related U.S. Application Data

(60) Provisional application No. 62/884,776, filed on Aug. 9, 2019.

(51) Int. Cl.
*H01L 21/768* (2006.01)
*H01L 21/02* (2006.01)
(Continued)

(52) U.S. Cl.
CPC .. *H01L 21/76847* (2013.01); *H01L 21/02071* (2013.01); *H01L 21/32136* (2013.01); *H01L 21/7684* (2013.01); *H01L 21/76846* (2013.01); *H01L 21/76849* (2013.01); *H01L 21/76865* (2013.01); *H01L 21/76883* (2013.01); *H01L 21/02063* (2013.01); *H01L 21/02068* (2013.01); *H01L 23/53209* (2013.01);
(Continued)

(58) Field of Classification Search
CPC ......... H01L 21/76847; H01L 21/02071; H01L 21/32136; H01L 21/7684; H01L 21/76846; H01L 21/76849; H01L 21/76883; H01L 21/76865; H01L 21/02068; H01L 21/02063; H01L 23/53266; H01L 23/53209; H01L 23/53223; H01L 23/53238; H01L 23/53252

See application file for complete search history.

(56) References Cited

U.S. PATENT DOCUMENTS 9,805,976 B2   10/2017 Shaviv et al.
10,879,115 B2 *  12/2020 Lee ..................... H01L 21/3212
(Continued)

OTHER PUBLICATIONS

International Search Report for PCT/US2020/044422, dated Nov. 9, 2020.

*Primary Examiner* — Kyoung Lee
*Assistant Examiner* — Christina A Sylvia
(74) *Attorney, Agent, or Firm* — Moser Taboada

(57) ABSTRACT

Methods and apparatus for forming an interconnect, including: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of the via, and a dielectric bottom of the trench; depositing a second barrier layer upon the dielectric sidewalls, top surface of the via, and the dielectric bottom of the trench; and filling the trench with a second metal different than the first metal.

20 Claims, 9 Drawing Sheets

(51) Int. Cl.
*H01L 21/3213* (2006.01)
*H01L 23/532* (2006.01)
(52) U.S. Cl.
CPC .. *H01L 23/53223* (2013.01); *H01L 23/53238* (2013.01); *H01L 23/53252* (2013.01); *H01L 23/53266* (2013.01)

(56) References Cited

U.S. PATENT DOCUMENTS

| | | | |
|---|---|---|---|
| 2003/0003603 A1* | 1/2003 | Chaudhry | H01L 28/10 438/3 |
| 2006/0228934 A1* | 10/2006 | Basol | H01L 23/53242 439/495 |
| 2009/0277867 A1* | 11/2009 | Mayer | C25D 17/06 216/13 |
| 2015/0097289 A1 | 4/2015 | Zhang | |
| 2016/0307793 A1 | 10/2016 | Huang et al. | |
| 2017/0287842 A1 | 10/2017 | Fu et al. | |
| 2018/0240682 A1 | 8/2018 | Lai et al. | |
| 2018/0350665 A1* | 12/2018 | Chae | H01L 23/5283 |
| 2019/0198444 A1 | 6/2019 | Amanapu et al. | |
| 2020/0388533 A1* | 12/2020 | You | H01L 21/32134 |

* cited by examiner

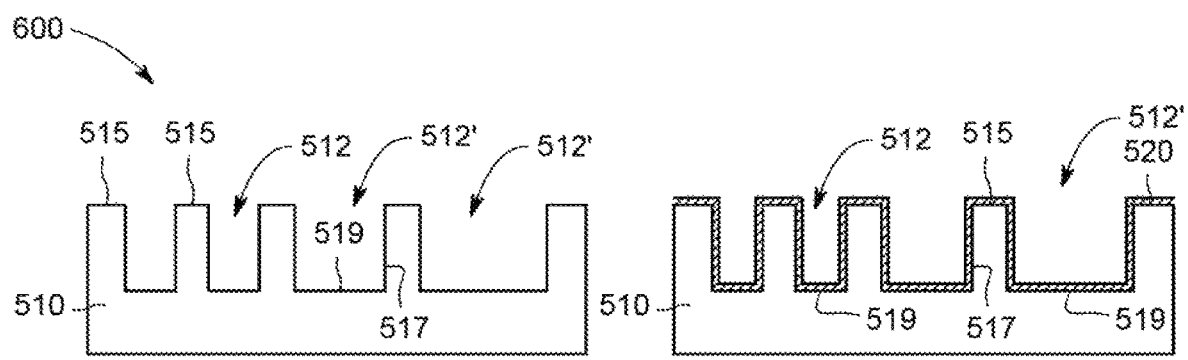
FIG. 6A
FIG. 6B
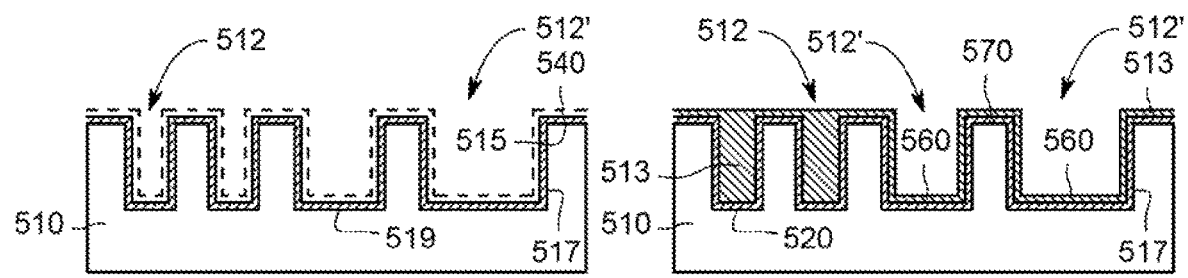
FIG. 6C
FIG. 6D
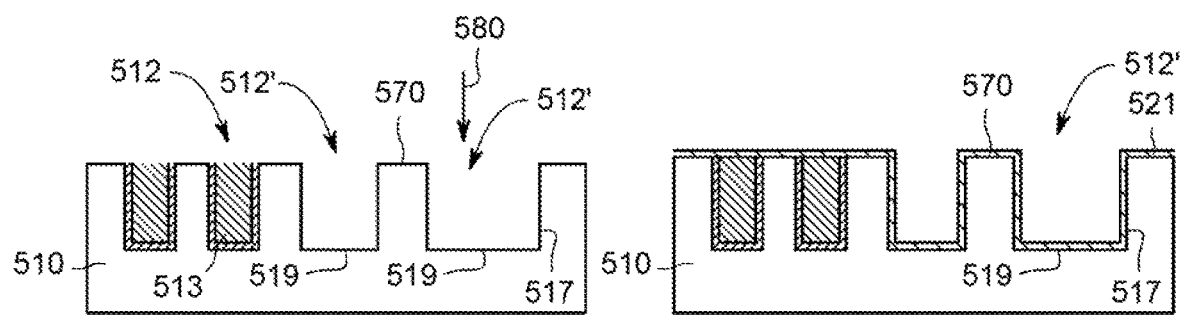
FIG. 6E
FIG. 6F
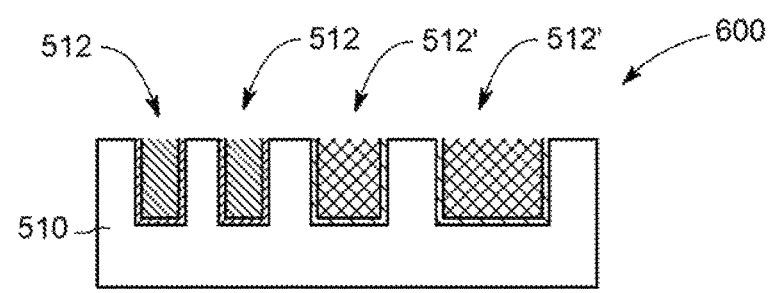
FIG. 6G

METHODS AND APPARATUS FOR HYBRID FEATURE METALLIZATION

CROSS-REFERENCE TO RELATED APPLICATION

This application claims priority benefit to U.S. provisional application Ser. No. 62/884,776 filed on Aug. 9, 2019 (herein entirely incorporated by reference).

FIELD

Embodiments of the present disclosure generally relate to improved methods of forming interconnects.

BACKGROUND

Reliably producing sub-100 nm and smaller features is one of the key technology challenges for next generation very large-scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success, and to the continued effort to increase circuit density and quality of individual substrate and die.

As circuit densities increase for next generation devices, the widths of interconnects, such as vias, trenches, contacts, gate structures, and other features, as well as the dielectric materials there between, decrease to 20 nm or below. The inventors have observed that conventional feature formation such as via formation can lead to a high resistance due to the materials used in process integration. For example, filling both a via and a trench connected thereto with the same material can lead to high interconnect resistance, which may undesirably lead to a resistive-capacitive delay (RC delay) and voltage drop (IR drop) in semiconductor chips. Further, at dimensions below 20 nm, the inventors have observed difficulties in achieving void-free filling of high-aspect ratio features with conductive metal. However, void-free filling is extremely important due to the propensity for any voids to migrate and coalesce under electrical stress, causing reliability failures. The inventors have found that void-free filling of narrow features with conductive metal is especially difficult where metallization below 20 nm or less is desired as selective deposition methods may be deficient due to limited ability to deposit or adhere to the sidewalls of a feature resulting in problematic void formation. Further, positioning of a barrier and liner layer may lead to high resistivities, for example leading to a high via resistance when deposited at a via bottom. Moreover, the small features of the metal interconnects themselves tend to increase the resistivity of the interconnect metal.

The inventors have also observed that varying feature widths for features such as two or more trenches disposed within a substrate may lead to different metal deposition coverage and problematic resistance variation.

Thus, the inventors have provided improved methods of forming interconnects to decrease manufacturing costs, resistance, and power consumption of integrated circuits, while increasing uniformity and reliability.

SUMMARY

Methods and apparatus for forming an interconnect, are provided herein. In some embodiments, a method of forming an interconnect, includes: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of the via, and a dielectric bottom of the trench; depositing a second barrier layer upon the dielectric sidewalls, top surface of the via, and the dielectric bottom of the trench; and filling the trench with a second metal different than the first metal.

In some embodiments, an integrated system includes a plurality of reaction chambers configured for: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of a via, and a dielectric bottom of the trench; depositing a second barrier layer upon the dielectric sidewalls, top surface of the via, and the dielectric bottom of the trench; and filling the trench with a second metal different than the first metal.

In some embodiments, a computer readable medium, having instructions stored thereon which, when executed, cause an integrated system to perform a method of forming an interconnect, including: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of the via, and a dielectric bottom of the trench; depositing a second barrier layer upon the dielectric sidewalls, top surface of the via, and the dielectric bottom of the trench; and filling the trench with a second metal different than the first metal.

In some embodiments, the present disclosure relates to a method of forming an interconnect, including: depositing a first barrier layer into at least one first feature having a width less than or equal to approximately 17 nm wide, and at least one second feature, wherein the second feature is wider than the first feature; filling the at least one first feature and at least one second feature with a first metal, wherein the first metal completely fills the at least one first feature and forms a conformal metal layer within the at least one second feature and upon a surface between the at least one first feature and at least one second feature; etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature; depositing a second barrier layer upon the dielectric sidewalls of the at least one second feature, the dielectric bottom of at least one second feature, and top surface of a dielectric field; and filling the at least one second features with a second metal different than the first metal.

In some embodiments, the present disclosure relates to a computer readable medium, having instructions stored thereon which, when executed, cause an integrated system to perform a method of forming an interconnect, including: depositing a first barrier layer into at least one first feature having a width less than or equal to approximately 17 nm wide, and at least one second feature, wherein the second feature is wider than the first feature; filling the at least one first feature and at least one second feature with a first metal, wherein the first metal completely fills the at least one first feature and forms a conformal metal layer within the at least one second feature and upon a surface between the at least one first feature and at least one second feature; etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature; depositing a second barrier layer upon the dielectric sidewalls of the at least one second feature, the dielectric bottom of at least one second feature, and top surface of a dielectric field; and filling the at least one second features with a second metal different than the first metal.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 6A-6G illustrate side cross-sectional views of features formed on a substrate at different stages according to an embodiment of the present disclosure.

Figure 1:
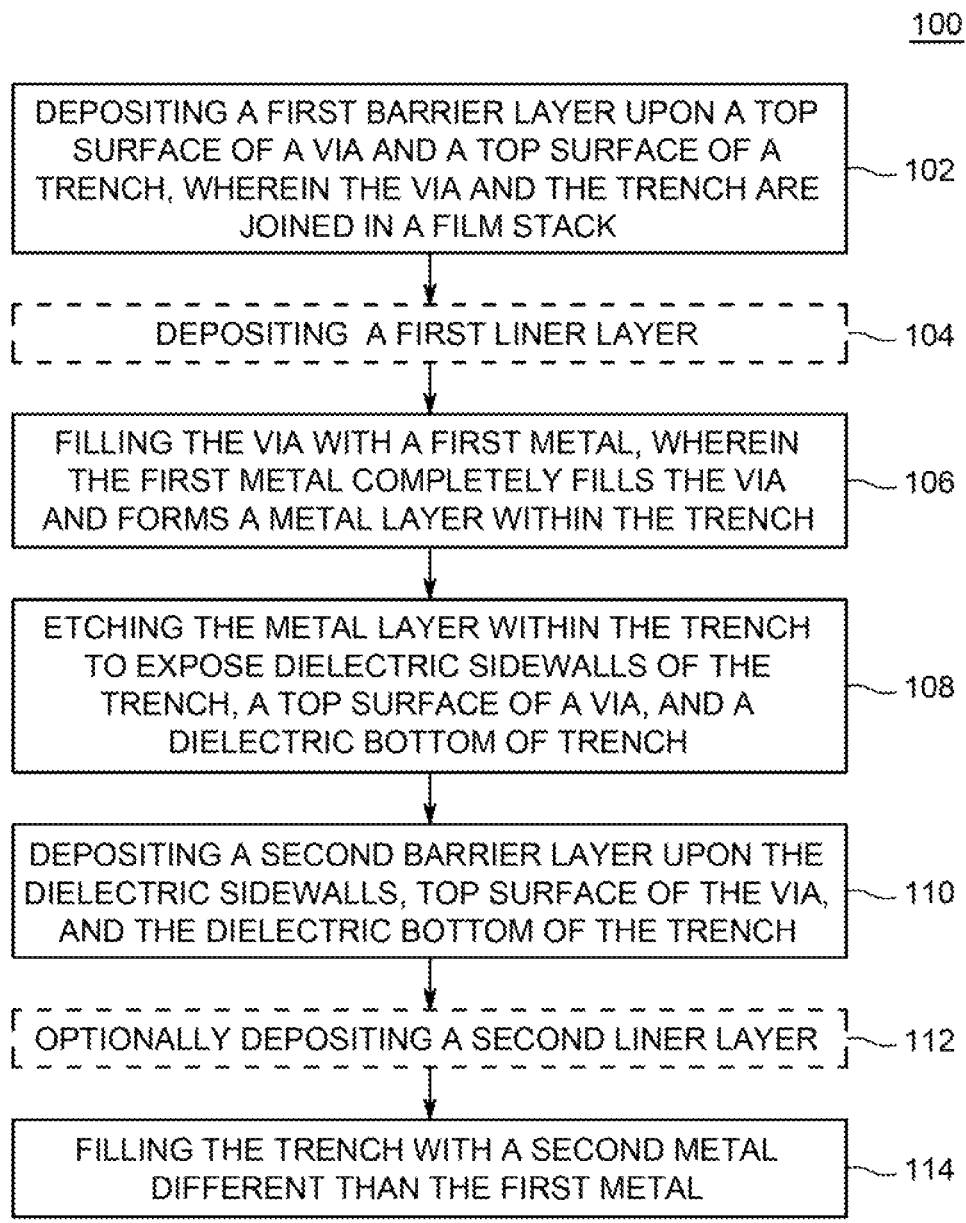
FIG. 1 illustrates a method of forming an interconnect according to one embodiment of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. Embodiments of the present disclosure advantageously maintain low-k integrity, electrical conductivity and reliability for integrated circuit (IC) interconnect structures. In embodiments, depositing a first metal to fill a feature such as a via is performed using a non-selective method to reduce or eliminate void formation within metal filled features. In some embodiments, varying the materials used in a via and a trench connected thereto advantageously reduces or eliminates RC delay and IR drop in semiconductor chips. Further, placement of the barrier and liner layers between a via and a trench connected thereto reduces via resistance. The methods of the present disclosure may be utilized in the formation of metal interconnects in an integrated circuit, or in the formation of a metal gate or a metal-contact gap fill process, as well as other suitable applications where decreasing the manufacturing costs, and resistance while increasing uniformity, reliability and power consumption of the integrated circuits is desirable.

FIG. 1 depicts a flow chart of a method 100 for processing a substrate in accordance with some embodiments of the present disclosure. The method 100 is described below with respect to the stages of processing a substrate as depicted in FIGS. 2A-2G which illustrate cross-sectional views of the substrate prior to, and at different stages of the method 100 of FIG. 1 and may be performed, for example, in a suitable reactor, such as is described below with respect to FIG. 3. Exemplary processing systems that may be used to perform the methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

Figure 2A:
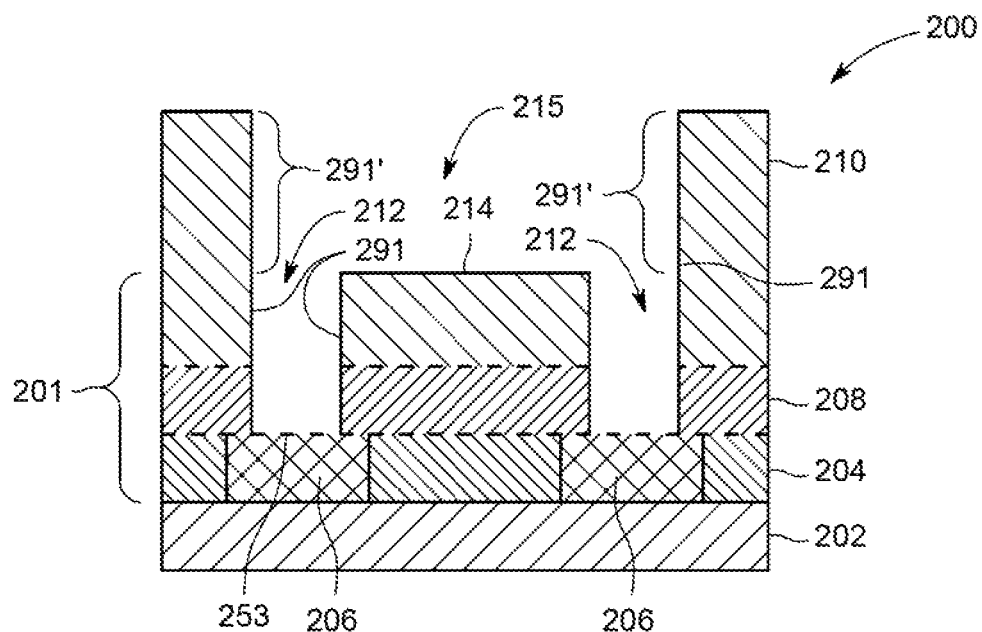
FIGS. 2A-2G illustrate side cross-sectional views of an interconnect formed on a substrate at different stages of the method of FIG. 1 according to one embodiment of the present disclosure.

FIG. 2A illustrates a cross-sectional view of an interconnect 200 prior to commencement of method 100. Generally, the interconnect 200 includes multiple film layers that may be utilized to form an interconnect structure, such as a dual damascene structure. A film stack 201 is formed on a substrate 202. The film stack 201 includes a second dielectric layer 204. The second dielectric layer 204, as shown in FIG. 2A, is disposed on the substrate 202 and has a conductive layer 206 formed in, and bounded by, the second dielectric layer 204. In one example, the second dielectric layer 204 may be formed from one or more insulating materials such as silicon oxide. In one example, the conductive layer 206 may be formed from a conductive layer, such as copper or cobalt, or tungsten.

In embodiments, a dielectric barrier layer 208 may optionally be disposed on the substrate 202, as illustrated in FIG. 2A. For example, as illustrated, the dielectric barrier layer 208 may be optionally deposited over both the second dielectric layer 204 and the conductive layer 206. Accordingly, the dielectric barrier layer 208 may form a uniform, uninterrupted, layer over the second dielectric layer 204 and the conductive layer 206. The dielectric barrier layer may be formed from a low-k material. For example, the dielectric barrier layer 208 may be formed from a carbon containing silicon layer (SiC), a nitrogen doped carbon containing silicon layer (SiCN), a silicon nitride layer, a metal nitride or metal oxide (e.g., AlN, AlOx, AlON), or the like. In embodiments, dielectric barrier layer 208, shown in phantom, is excluded and dielectric layer 210 may be directly atop second dielectric layer 204 and conductive layer 206.

In embodiments, dielectric layer 210 is deposited on the substrate 202, as illustrated in FIG. 2A. For example, as illustrated, the dielectric layer 210 is deposited over the dielectric barrier layer 208. The dielectric layer 210 may be substantially similar to second dielectric layer 204. In one embodiment, dielectric layer 210 may be formed from the same material as second dielectric layer 204. In another embodiment, dielectric layer 210 may be formed from a different material than second dielectric layer 204, while maintaining the same low-k properties. In another example, the dielectric layer 210 may be formed from a low-k material (e.g., a material having a dielectric constant less than silicon oxide, or less than about 3.9), or the like. In embodiments, dielectric layer 210 is a dense material such as Black Diamond® brand low-k material available from Applied Materials, Inc.

In embodiments, interconnect 200 is a workpiece including one or more vias such as via 212 or one or more trenches such as trench 215 to be filled with metal in accordance with the present disclosure. For example, interconnect 200 may include one or more vias such as via 212 including a top surface 291 of a via and a top surface 291' of a trench 215 in a film stack 201. In embodiments, the top surface 291 of a via 212 is joined with and is an extension of the top surface 291' of trench 215 except it is positioned within via 212.

In some embodiments, one or more vias such as via 212 may be formed by etching through dielectric layer 210 and the optional dielectric barrier layer such as dielectric barrier layer 208 to expose the underlying conductive layer 206. Generally, the vias 212 have a width, W1. In some embodiments, the width of each via 212 is uniform from a top of the via 212 to a bottom of the via 212. In other embodiments, the width of each via 212 may change gradually from a top of the via 212 to a bottom of the via 212. In embodiments, via 212 has a high aspect ratio. For example via 212 may have an aspect ratio of 4:1 to 15:1, or more.

In embodiments, one or more trenches such as trench 215 is formed in the interconnect 200, as illustrated in FIG. 2A. The one or more trenches such as trench 215 may be formed into the dielectric layer 210. In embodiments, the one or more trenches such as trench 215 are configured to widen at least a portion of the via 212. In some embodiments, the one or more trenches such as trench 215 may be formed before the via 212. In other embodiments, the one or more trenches such as trench 215 are formed subsequent to the forming of the via 212 or one or more vias.

Figure 2B:
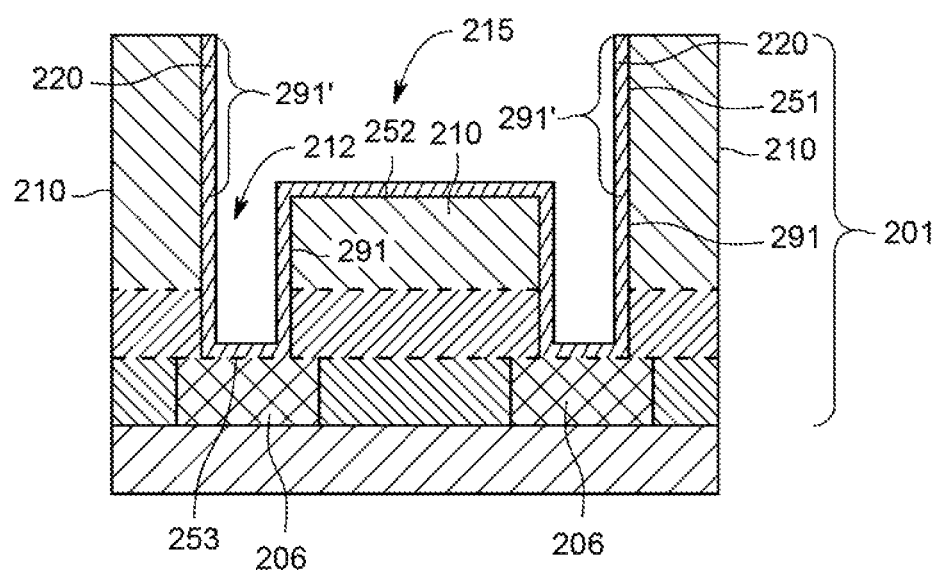

Referring now to FIG. 1, and FIG. 2B the method 100 for forming an interconnect may begin at process sequence 102 by depositing a first barrier layer 220 upon a top surface 291 of a via 212 and a top surface 291' of a trench 215 in a film stack 201. In embodiments, first barrier layer 220 may form a uniform, uninterrupted, layer directly atop the dielectric layer 210, top surface 291 of a via 212, top surface 291' of a trench 215, and over the conductive layer 206.

In some embodiments, the interconnect 200 may include a first barrier layer 220 disposed atop the dielectric layer 210, top surface 291 of a via 212, top surface 291' of a trench 215, and over the conductive layer 206. For example, the sidewall(s) 251 of the trench the bottom surface 252 of the trench including the exposed metal surface 253 of via 212 may be covered by a first barrier layer 220 In embodiments, first barrier layer 220 may be formed by a CVD or PVD process performed in a process chamber to provide a first barrier layer 220 having a predetermined thickness over the surface of the dielectric layer 210 within the trench 215 and dielectric surface of the one or more vias such as via 212. In embodiments, first barrier layer 220 is a metal nitride, such as titanium nitride (TiN), tantalum nitride (TaN), tungsten nitride (WN), or the like deposited via a physical vapor deposition (PVD) process atop sidewalls and a bottom surface of a trench. In embodiments, the first barrier layer 220 is deposited to a thickness of 20 to 40 angstroms such as 30 angstroms. In embodiments, the first barrier layer 220 liner layer is titanium nitride (TiN), tantalum nitride (TaN) deposited to a thickness of 20 to 40 angstroms such as 30 angstroms. In some embodiments, first barrier layer 220 such as a titanium nitride (TiN) layer, or tantalum nitride (TaN) layer is conformally deposited to cover atop the dielectric layer 210, top surface 291 of a via 211, top surface 291' of a trench 215, and over the conductive layer 206.

In some embodiments, first barrier layer 220 may comprise or consist of an adhesion layer or nucleation layer disposed atop the dielectric layer 210, top surface 291 of a via 212, top surface 291' of a trench 215, and over the conductive layer 206. For example, in some embodiments, the metal to be contained by the first barrier layer 220 such as tungsten or ruthenium may not need a barrier layer comprising a TiN layer or TaN layer, however an adhesion layer or nucleation layer of, e.g., tungsten or ruthenium may be deposited in an amount sufficient to contain the metal within the feature such as a feature comprising a dielectric surface interior. In some embodiments, metals like cobalt and copper to be deposited within a dielectric feature include first barrier layer 220 comprising a TiN layer or TaN layer in an amount sufficient to hold the cobalt or copper within the feature. In some embodiments, metals like tungsten or ruthenium to be deposited within a dielectric feature include a first barrier layer 220 comprising a nucleation layer or adhesion layer in thickness sufficient to hold the tungsten or ruthenium within the feature.

Figure 2C:
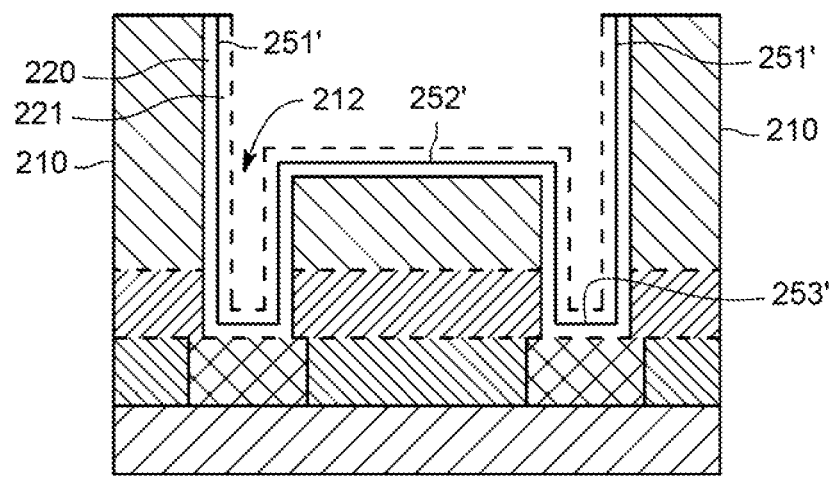

Referring now to FIG. 1 at block 104, and FIG. 2C, in some embodiments, a first liner layer 221 may optionally be deposited upon the first barrier layer 220. For example, the sidewall(s) 251' of the trench the bottom surface 252' of the trench including above the exposed metal surface 253' of via 212 may be covered by a first liner layer 221. In embodiments, the first liner layer 221 is disposed directly atop first barrier layer 220. In some embodiments, the first liner layer 221 may serve to prevent diffusion of a subsequently deposited metal into underlying layers, such as dielectric layer 210. In embodiments, the first liner layer 221 may include any material suitable to act as a barrier. For example, in some embodiments, the first liner layer 221 may include a metal, for example, titanium (Ti), tantalum (Ta), cobalt (Co) such as CVD deposited cobalt), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The first liner layer 221 may have any thickness suitable to prevent the diffusion of subsequently deposited metal layer materials into underlying layers. For example, in some embodiments, the first liner layer 221 layer may have a thickness of about 10 to about 20 angstroms, or 10 to 15 angstroms. The first liner layer 221 may be formed by any process suitable to provide the first liner layer 221 having a suitable thickness. For example, in some embodiments, the first liner layer 221 may be formed via a deposition process, such as chemical vapor deposition, physical vapor deposition, or a cyclical deposition process, for example, such as atomic layer deposition, or the like. In embodiments, the first liner layer 221 comprises one of more layers of TaN deposited by atomic layer deposition (ALD) process. In embodiments, an ALD process may deposit TaN to form first liner layer 221, or one or more layers of first liner layer 221 to a thickness sufficient to function as a liner layer. In embodiments, first liner layer 221 comprises a layer of material conformally deposited atop the internal trench and via surfaces.

In some embodiments, the first barrier layer 220 and first liner layer 221 may be provided alone or in combination to form a first barrier layer 220. In embodiments, the first barrier layer 220 comprises materials suitable for forming the first liner layer. In some embodiments, the first barrier layer 220 comprises a metal nitride, such as titanium nitride (TiN), tantalum nitride (TaN), tungsten nitride (WN), or the like. The first barrier layer 220 may have any thickness suitable to prevent the diffusion of subsequently deposited metal layer materials into underlying layers. For example, in some embodiments, the first barrier layer 220 layer may have a thickness of about 10 to about 20 angstroms, or 10 to 15 angstroms.

Figure 2D:
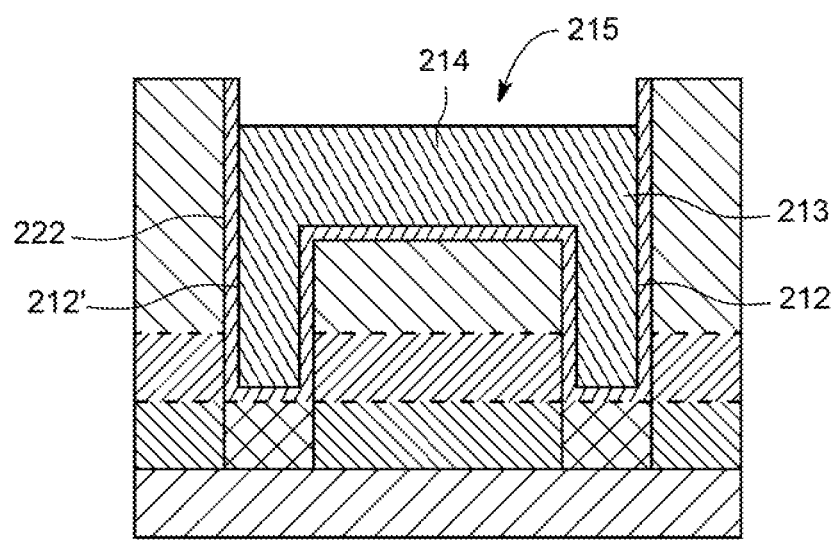

Referring now to FIG. 1 at block 106 and FIG. 2D, method 100 includes filling one or more vias such as via 212 with a first metal 213, wherein the first metal 213 completely fills the via 212 and forms a metal layer 214 within the trench 215. In embodiments, first metal 213 non-selectively fills the via 212, as illustrated in FIG. 2D. For example, a first metal 213 material is deposited in the via 212 up to a point 222 where the via 212 meets the trench 215. The first metal 213 used may be any suitable metal material such as ruthenium (Ru), tungsten (W), cobalt (Co), aluminum (Al), copper (Cu), or the like. In some embodiments, first metal 213 is a different material as the subsequent metal deposited in the trench 215. In embodiments, non-electively depositing the first metal 213 in the via 212 aids in reducing or eliminating void formation within first metal 213, and meeting reliability and line resistance requirements. In some embodiments, the first metal in first via such as via 212 is the same as the first metal used in second via such as via 212'. For example, in embodiments, first metal in via 212 is cobalt, and the first metal in via 212' is cobalt.

In embodiments, the first metal 213 may be deposited using a chemical vapor deposition (CVD) process. In embodiments, a suitable CVD process for use herein may include a hydrogen ($H_2$) pre-soak at elevated temperatures (e.g., 350-500° C.). In some embodiments, the CVD process may be performed at temperatures of about 150-500° C., using a low flow rate (e.g., 2-100 sccm) of a metal-containing precursor (e.g., $WF_6$) in a vast $H_2$ ambient environment. In embodiments, a metal-containing precursor is preselected to form at least one of ruthenium (Ru), tungsten (W), cobalt (Co), aluminum (Al), Copper (Cu), nickel (Ni) in the via. The combination of flow rate, pressure, and temperature aids in reducing morphology of the first metal 213 when deposited. In some embodiments, prior to the first metal 213 material being deposited, a conventional nucleation layer may be applied for the initial 1-3 nm of nucleation. The overall growth amount is controlled by process time, pressure, and precursor flow to uniformly fill the via 212 or via 212' as shown in FIG. 2D.

Figure 2E:
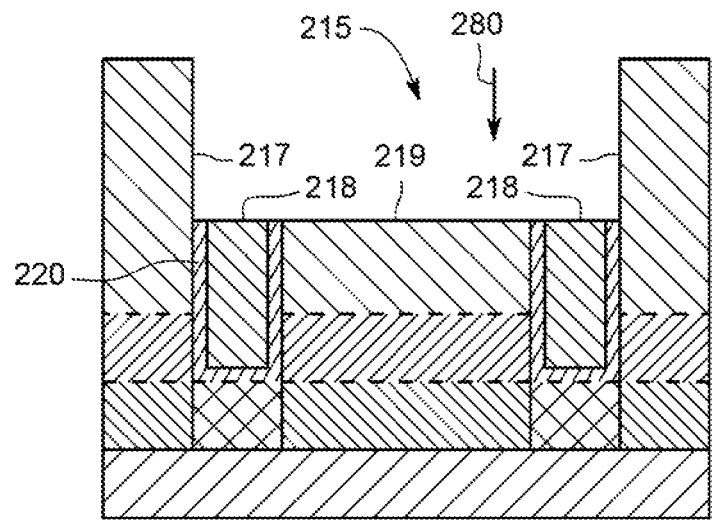

Referring now to FIG. 1 at block 108 and FIG. 2E, method 100 includes etching the metal layer 214 within the trench 215 to expose dielectric sidewalls 217 of the trench, a top surface 218 of a via 212, and a dielectric bottom 219 of the trench 215. In some embodiments, metal layer 214 is etched to remove a portion thereof. In some embodiments, etching the metal layer 214 within the trench 215 to expose dielectric sidewalls 217 of the trench 215 comprises removing the first barrier layer 220, and if present the first liner layer 221 within the trench.

In some embodiments, etching comprises atomic layer etching. In embodiments, portions of metal layer 214 may be removed by a cyclic atomic layer etching process in an atomic layer etch (ALE) chamber. In embodiments the etching is one directional such as in the direction of arrow 280 to focus removal of the portions of metal layer 214, first barrier layer or first liner layer described above. In embodiments, atomic layer etching may include a directional plasma application (oxygen, hydrogen, chlorine, or other halides) to modify metal in direct view or perpendicular to arrow 280. The ALE process may include treating the surface, etching the surface, annealing the surface, and repeating the sequence until an amount of metal material is removed to expose the dielectric sidewalls 217 of the trench, a top surface 218 of a via 212, and a dielectric bottom 219 of the trench 215. In embodiments, the etch stop is on the via 212 and metal therein and the dielectric bottom 219 of the trench 215 which may be a low-k dielectric layer. In some embodiments, etching comprises removing a first metal such as cobalt or nickel from a trench, and sidewalls of a trench, wherein cobalt or nickel stays within the one or more vias.

Figure 3:
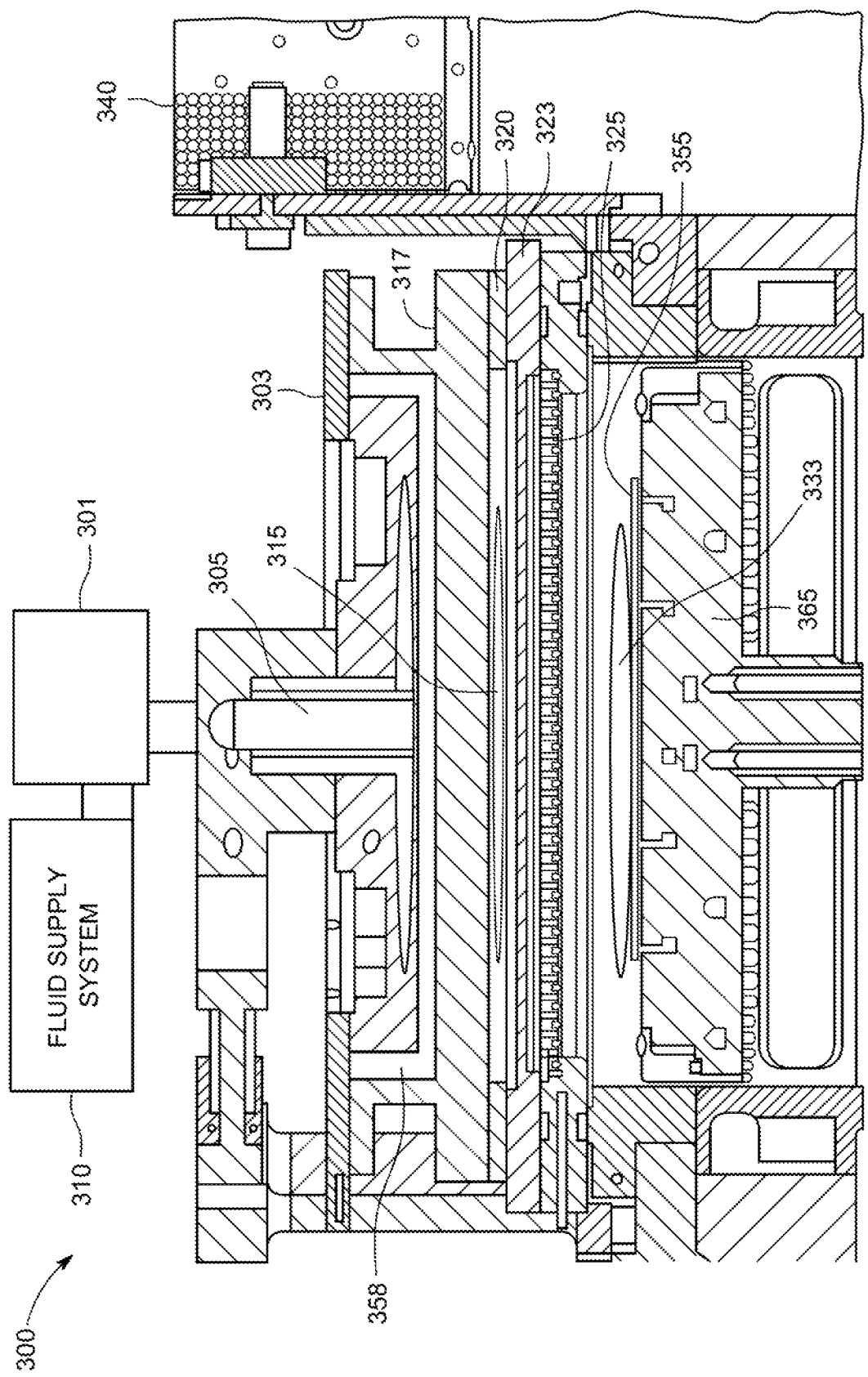
FIG. 3 depicts an etch chamber suitable for performing etching in accordance with some embodiments of the present disclosure.

A non-limiting example an exemplary etching chamber system such as process chamber 300 is shown in FIG. 3. During metal layer etching, a process gas may be flowed into the first plasma region 315 through a gas inlet assembly 305. A remote plasma system (RPS) 301 may optionally be included in the system and may process a first gas which then travels through gas inlet assembly 305. The gas inlet assembly 305 may include two or more distinct gas supply channels where the second channel (not shown) may bypass the RPS 301, if included.

A cooling plate 303, faceplate 317, ion suppressor 323, showerhead 325, and a pedestal 365, having a substrate 355 disposed thereon, are shown in FIG. 3 and may each be included according to embodiments. The pedestal 365 may have a heat exchange channel through which a heat exchange fluid flows to control the temperature of the substrate, which may be operated to heat and/or cool the substrate or wafer during processing operations. The wafer support platter of the pedestal 365, which may comprise aluminum, ceramic, or a combination thereof, may also be resistively heated in order to achieve relatively high temperatures, such as from up to or about 100 degrees Celsius to above or about 600 degrees Celsius, using an embedded resistive heater element.

The faceplate 317 may be pyramidal, conical, or of another similar structure with a narrow top portion expanding to a wide bottom portion. The faceplate 317 may additionally be flat as shown and include a plurality of through-channels used to distribute process gases. Plasma generating gases and/or plasma excited species, depending on use of the RPS 301, may pass through a plurality of holes (not shown).

Non-limiting exemplary configurations may include having the gas inlet assembly 305 open into a gas supply region 358 partitioned from the first plasma region 315 by faceplate 317 so the gases/species flow through the holes in the faceplate 317 into the first plasma region 315. Structural and operational features may be selected to prevent significant backflow of plasma from the first plasma region 315 back into the gas supply region 358, gas inlet assembly 305, and fluid supply system 310. The faceplate 317, or a conductive top portion of the chamber, and showerhead 325 are shown with an insulating ring 320 located between the features, which allows an AC potential to be applied to the faceplate 317 relative to showerhead 325 and/or ion suppressor 323. The insulating ring 320 may be positioned between the faceplate 317 and the showerhead 325 and/or ion suppressor 323 enabling a capacitively coupled plasma (CCP) to be formed in the first plasma region. A baffle (not shown) may additionally be located in the first plasma region 315, or otherwise coupled with gas inlet assembly 305, to affect the flow of fluid into the region through gas inlet assembly 305.

The ion suppressor 323 may comprise a plate or other geometry to define a plurality of apertures throughout the structure configured to suppress the migration of ionically-charged species out of the first plasma region 315 while allowing uncharged neutral or radical species to pass through the ion suppressor 323 into an activated gas delivery region between the suppressor and the showerhead. In embodiments, the ion suppressor 323 may comprise a perforated plate with a variety of aperture configurations.

Uncharged species may include highly reactive species suitable for transporting with less reactive carrier gas through the apertures. As noted above, the migration of ionic species through the holes may be reduced, and in some instances completely suppressed. Controlling the amount of ionic species passing through the ion suppressor 323 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter the etch selectivity of the gas mixture.

The plurality of apertures in the ion suppressor 323 may be configured to control the passage of the activated gas, i.e., the ionic, radical, and/or neutral species, through the ion suppressor 323. For example, the aspect ratio of the holes, or the hole diameter to length, and/or the geometry of the holes may be controlled so the flow of ionically-charged species in the activated gas passing through the ion suppressor 323 is reduced. The holes in the ion suppressor 323 may include a tapered portion facing the plasma excitation region such as the first plasma region 315, and a cylindrical portion facing the showerhead 325. The cylindrical portion may be shaped and dimensioned to control the flow of ionic species passing to the showerhead 325. An adjustable electrical bias may also be applied to the ion suppressor 323 as an additional means to control the flow of ionic species through the suppressor.

The ion suppressor 323 may function to reduce or eliminate the amount of ionically charged species traveling from the plasma generation region to the substrate. Uncharged neutral and radical species may still pass through the openings in the ion suppressor to react with the substrate. The complete elimination of ionically charged species in the reaction region surrounding the substrate may not be performed in embodiments. In certain instances, ionic species are intended to reach the substrate in order to perform the etch process. In embodiments, the ion suppressor may help to control the concentration of ionic species in the reaction region at a level suitable for assisting the process.

Showerhead 325 in combination with ion suppressor 323 may allow a plasma present in first plasma region 315 to avoid directly exciting gases in substrate processing region 333, while still allowing excited species to travel from chamber plasma region such as the first plasma region 315 into substrate processing region 333. Thus, the chamber may be configured to prevent the plasma from contacting a substrate 355 being etched, which can advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, the oxide material may be further protected by maintaining the plasma remotely from the substrate.

The processing system may further include a power supply 340 electrically coupled with the processing chamber to provide electric power to the faceplate 317, ion suppressor 323, showerhead 325, and/or pedestal 365 to generate a plasma in the first plasma region 315 or substrate processing region 333. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the first plasma region 315. Providing a tunable plasma, in turn, may advantageously allow development of particular plasma characteristics for precursors to be dissociated in specific ways to enhance the etching profiles produced by the precursors.

A plasma may be ignited either in chamber plasma region such as the first plasma region 315 above showerhead 325 or substrate processing region 333 below showerhead 325. Plasma may be present in chamber plasma region such as the first plasma region 315 to produce the radical precursors from an inflow of, for example, a chlorine-containing precursor or other precursor. An AC voltage typically in the radio frequency (RF) range may be applied between the pedestal 365, and showerhead 325 and/or ion suppressor 323 to ignite a plasma in chamber plasma region such as the first plasma region 315 during deposition. An RF power supply may generate a high RF frequency of 13.56 MHz but may also generate other frequencies alone or in combination with the 13.56 MHz frequency. In embodiments, RF energy is applied to the pedestal 365.

In some embodiments, after the etching process at 108, the substrate may be cleaned to remove byproducts from the substrate surfaces such as within via 212 and trench 215.

Figure 2F:
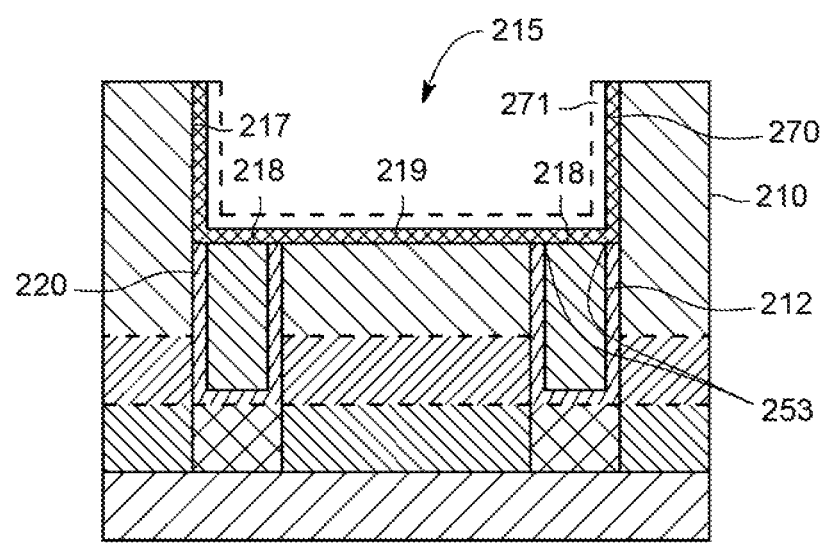

In some embodiments, after the etching process at 108, method 100 includes as shown in FIG. 1 at block 110 and FIG. 2F depositing a second barrier layer 270 upon the dielectric sidewalls 217, top surface 218 of the via 212, and the dielectric bottom 219 of the trench 215. In embodiments, trench 215 may be covered with one or more second barrier layers such as a second barrier layer 270. For example, the sidewall(s) of the trench such as dielectric sidewalls 217, the bottom surface such as dielectric bottom 219 of trench 215 including the exposed metal surface 253 of via 212 may be covered by a second barrier layer 270. The second barrier layer 270 may serve to prevent diffusion of a subsequently deposited metal into underlying layers, such as dielectric layer 210. The second barrier layer 270 may include any material suitable to act as a barrier. For example, in some embodiments, the second barrier layer 270 may include a metal, for example, titanium (Ti), tantalum (Ta), cobalt (Co), such as CVD deposited cobalt, manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The second barrier layer 270 may have any thickness suitable to prevent the diffusion of subsequently deposited metal layer materials into underlying layers. For example, in some embodiments, the second barrier layer 270 layer may have a thickness of about 5 to about 20 angstroms, or 5 to 15 angstroms. The second barrier layer 270 may be formed by any process suitable to provide the second barrier layer 270 having a suitable thickness. For example, in some embodiments, the second barrier layer 270 may be formed via a deposition process, such as chemical vapor deposition, physical vapor deposition, or a cyclical deposition process, for example, such as atomic layer deposition, or the like. In embodiments, the second barrier layer 270 comprises one of more layers of TaN deposited by atomic layer deposition (ALD) process. In embodiments, an ALD process may deposit TaN to form second barrier layer 270, or one or more layers of second barrier layer 270 to a thickness sufficient to function as a barrier layer. In embodiments, second barrier layer 270 comprises a layer of material conformally deposited atop the internal trench surfaces.

Referring to FIG. 1 at block 112 and FIG. 2F, second barrier layer 270 may optionally be covered in one or more additional liner layers such as second liner layer 271 shown in phantom in FIG. 2F. In some embodiments, the interconnect 200 may include a second liner layer 271 including cobalt or ruthenium disposed atop the second barrier layer 270. In embodiments, second liner layer 271 may be formed by a CVD or PVD process performed in a process chamber to provide a liner layer having a predetermined thickness over the surface of the second barrier layer 270 within the trench 215. In embodiments, second liner layer 271 is a cobalt or ruthenium layer deposited via a physical vapor deposition (PVD) process atop sidewalls and a bottom surface of a trench. In embodiments, the second liner layer 271 is deposited to a thickness of 20 to 40 angstroms such as 30 angstroms. In embodiments, the second liner layer 271 is cobalt or ruthenium deposited to a thickness of 20 to 40 angstroms such as 30 angstroms. In some embodiments, second liner layer 271 such as a cobalt layer or ruthenium layer is conformally deposited to cover the second barrier layer 270.

Figure 2G:
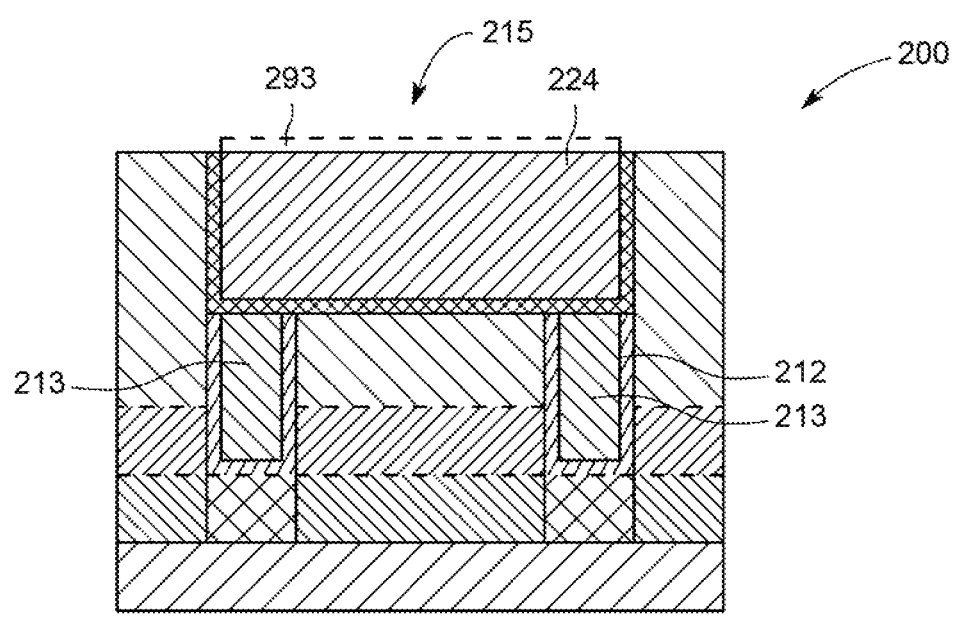

Referring back to FIG. 1, at block 114, and FIG. 2G, a second metal 224 is deposited in each trench 215. For example, the second metal 224 is deposited atop second barrier layer 270 to a top of the trench 215. The second metal 224 used may be any suitable metal material such as ruthenium (Ru), tungsten (W), cobalt (Co), aluminum (Al), copper (Cu), and the like. In some embodiments, second metal 224 is a different material than the first metal 213 material deposited in the via 212. In some embodiments, second metal 224 is the same material as the first metal 213 material deposited in the via 212. In some embodiments, the second metal 224 may be deposited using a PVD/ECD (electrochemical deposition) process sequence. For example, second metal may be copper deposited using a PVD/ECD (electrochemical deposition) process sequence. In embodiments, bifurcating the conventional metal fill of a singular metal material into a multistep process involving a first metal 213 deposited in the via 212, a second metal 224 deposited in the trench 215 and a second barrier layer 270 and/or second liner layer 271 disposed between the first metal 213 and second metal 224 aids in decreasing the resistance through the via 212. In some embodiments, second metal 224 is planarized after deposition. In some embodiments, a capping layer 293 may be deposited atop the second metal 224 after deposition and/or planarization. In embodiments, a capping layer 293 comprises cobalt, ruthenium or other suitable capping material. In some embodiments, the second metal is copper.

The methods described herein may be performed in individual process chambers provided in a standalone configuration or as part of one or more cluster tools, for example, an integrated tool 400 (i.e., cluster tool) described below with respect to FIG. 4. Examples of the integrated tool 400 include the ENDURA®, CENTURA®, PRODUCER® or CENTRIS® line of processing systems, available from Applied Materials, Inc., of Santa Clara, Calif. However, the methods described herein may be practiced using other cluster tools having suitable process chambers coupled thereto, or in other suitable process chambers. In embodiments, a single chamber may be configured to perform the process sequences of the present disclosure. In embodiments, a suitable integrated system includes: a plurality of reaction chambers configured for: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of a via, and a dielectric bottom of the trench; depositing a second barrier layer upon the dielectric sidewalls, top surface of the via, and the dielectric bottom of the trench; and filling the trench with a second metal. In embodiments, the second metal is different than the first metal. In some embodiments, the integrated system further includes a vacuum substrate transfer chamber, an atomic layer etching chamber, wherein the atomic layer etching chamber is coupled to the vacuum substrate transfer chamber; and wherein the atomic layer etching chamber is configured for expose dielectric sidewalls of the trench, a top surface of a via, and a dielectric bottom of the trench; and at least one additional chamber for substrate processing, wherein the substrate processing system is configured to move a substrate from the atomic layer etching chamber to the at least one additional chamber under vacuum.

Figure 4:
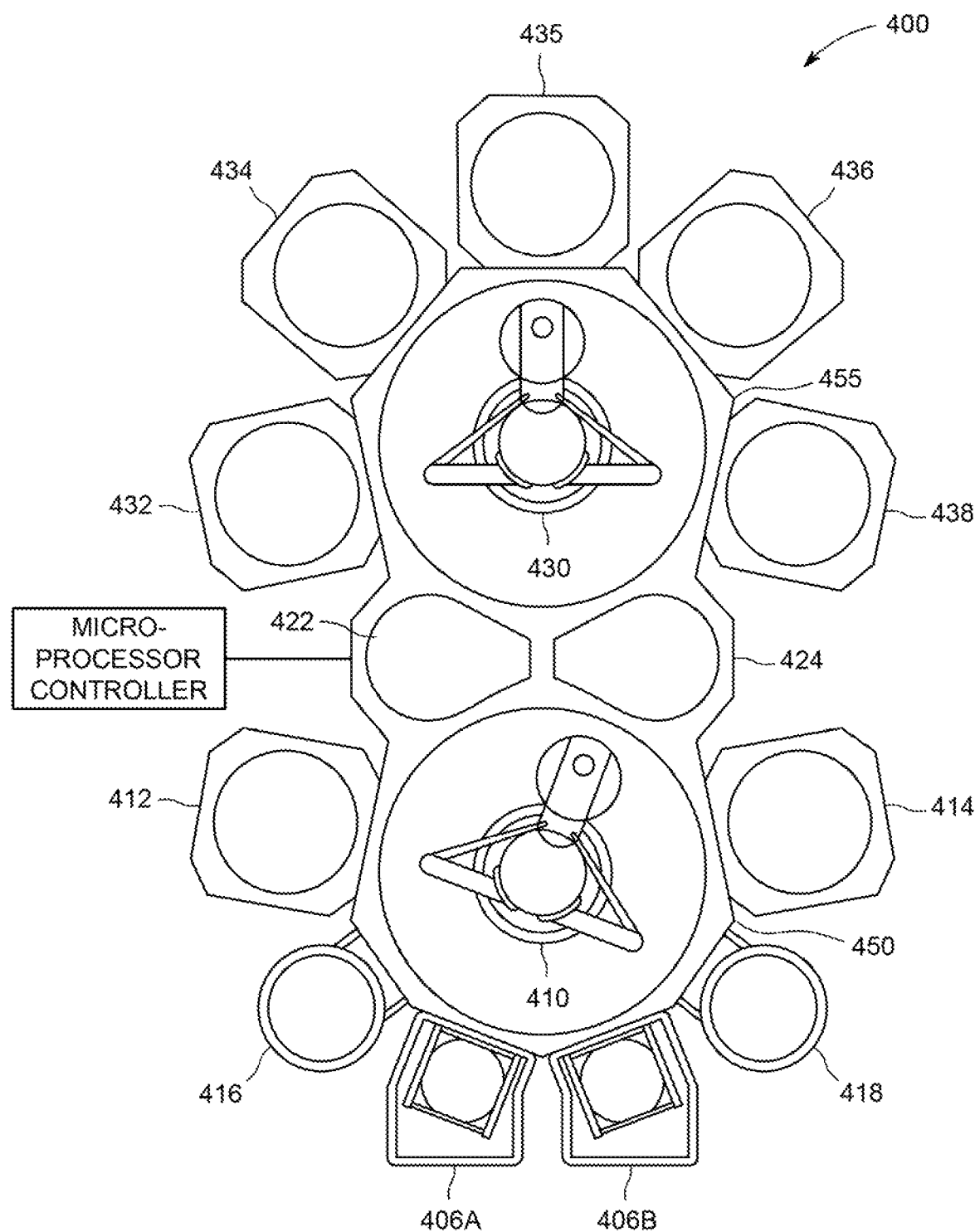
FIG. 4 depicts a cluster tool suitable for making interconnect structures in accordance with one embodiment of the present disclosure.

Referring now to FIG. 4, an integrated tool 400 can include two load lock chambers 406A, 406B for transferring of substrates into and out of the integrated tool 400. Typically, since the integrated tool 400 is under vacuum, the load lock chambers 406A, 406B may pump down the pressure within the load lock chambers when substrates are introduced into the integrated tool 400. A first robot 410 may transfer the substrates between the load lock chambers 406A, 406B, and a first set of one or more substrate processing chambers 412, 414, 416, 418 (four are shown) coupled to a first transfer chamber 450. Each of the substrate processing chambers 412, 414, 416, 418, can be outfitted to perform a number of substrate processing operations. In some embodiments, the first set of one or more substrate processing chambers 412, 414, 416, 418 may include any combination of PVD, ALD, CVD, ALE, etch, degas, or pre-clean chambers. For example, in some embodiments, the processing chambers, 412, 414, 416, 418 include two pre-clean chambers and a deposition chamber configured to deposit second metal in accordance with the present disclosure, such as a PVD chamber configured to deposit copper at processing chamber 412, and a deposition chamber configured to deposit a second liner layer such as TiN at processing chamber 414.

The first robot 410 can also transfer substrates to/from two intermediate transfer chambers 422, 424. The intermediate transfer chambers 422, 424 can be used to maintain ultrahigh vacuum conditions while allowing substrates to be transferred within the integrated tool 400. A second robot 430 can transfer the substrates between the intermediate transfer chambers 422, 424 and a second set of one or more substrate processing chambers 432, 434, 435, 436, 438 coupled to a second transfer chamber 455. The substrate processing chambers 432, 434, 435, 436, 438 can be outfitted to perform a variety of substrate processing operations including the methods described above in addition to, physical vapor deposition processes (PVD), chemical vapor deposition (CVD), etching, orientation and other substrate processes. In some embodiments, the second set of one or more substrate processing chambers 432, 434, 435, 436, 438 may include any combination of atomic layer etch chambers (ALE) configured to etch the metal layer of the present disclosure such as process chamber 435, deposition chambers configured to deposit metal as described above such as process chamber 432 configured to deposit PVD cobalt, process chamber 434 configured to deposit CVD cobalt, deposit chamber 436 configured to deposit a barrier layer material by a PVD deposition, and deposit chamber 438 configured to deposit a barrier layer by an ALD process.

In some embodiments, the integrated tool may be equipped with a processor including memory stored thereon. In embodiments, a computer readable medium, having instructions stored thereon which, when executed, cause an integrated system to perform a method of forming an interconnect, including: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of the via, and a dielectric bottom of the trench; depositing a second barrier layer upon the dielectric sidewalls, top surface of the via, and the dielectric bottom of the trench; and filling the trench with a second metal different than the first metal. In some embodiments, the via and the trench are joined in a film stack.

In some embodiments, the computer readable medium causes the integrated system to further perform depositing a first liner layer on the first barrier layer. In some embodiments, the computer readable medium causes the integrated system to further perform depositing a second liner layer on the second barrier layer. In some embodiments, the computer readable medium causes the integrated system to further perform etching to form dielectric material sidewalls.

In some embodiments, a method of forming an interconnect, includes: depositing a first barrier layer upon a top surface of a via and a top surface of a trench, filling the via with a first metal, wherein the first metal completely fills the via and forms a metal layer within the trench; etching the metal layer within the trench to expose dielectric sidewalls of the trench, a top surface of a via, and a dielectric bottom of the trench; depositing a second barrier layer upon the dielectric sidewalls, top surface of the via, and the dielectric bottom of the trench; and filling the trench with a second metal different than the first metal. In some embodiments, the methods further include depositing a first liner layer on the first barrier layer. In some embodiments, the methods further include depositing a second liner layer on the second barrier layer. In some embodiments, etching the metal layer within the trench to expose dielectric sidewalls of the trench comprises removing the first barrier layer within the trench. In some embodiments, cleaning the trench is performed after etching. In some embodiments, etching comprises atomic layer etching. In some embodiments, the first barrier layer is titanium nitride (TiN), tantalum nitride (TaN), or combinations thereof. In some embodiments, the first metal is cobalt, nickel, ruthenium, tungsten, aluminum, rhodium, iridium, molybdenum or combinations thereof. In some embodiments; the second metal is copper. In some embodiments, the second barrier layer is a material suitable preventing a diffusion of copper out of the trench. In some embodiments, planarizing a top of the second metal forms a flat surface of the second metal. In some embodiments, a capping layer is disposed atop the second metal.

In some embodiments, a method of forming an interconnect, includes: depositing a first barrier layer upon a top surface of a via and a top surface of a trench; filling the via with a first metal, wherein the first metal completely fills the via and forms a metal layer within the trench; etching the metal layer within the trench to expose dielectric sidewalls of the trench, a top surface of a via, and a dielectric bottom of the trench; depositing a second barrier layer upon the dielectric sidewalls, top surface of the via, and the dielectric bottom of the trench; and filling the trench with a second metal. In some embodiments, a plurality of vias may comprises a plurality of first metals. In some embodiments, the trench is filled with a second metal or one or more second metals. In some embodiments, the via and the trench are joined in a film stack.

In some embodiments of the present disclosure, a plurality of features such as trenches may be filled with a different metal, based upon the width of the trench. In some embodiments, the present disclosure relates to a method of forming an interconnect where two or more trenches have various widths such as a narrow width below 17 nm wide, and a width wider than 17 nm, such as between 20 to 50 nm. In some embodiments, X refers to a feature such as a trench width greater than zero and less than or equal to approximately 17 nm. In some embodiments, X refers to a feature width such as a trench width greater than zero and less than or equal to approximately 15 nm. In some embodiments, a 2X feature such as a trench will have a width of twice that of a 1X feature such as a trench and so on. In some embodiments, a limitation is placed such that a next larger feature size wider than the 1X feature is at least 2X or larger. In some embodiments, the larger feature size wider than 1X feature, is limited to 2X to 5X. In some embodiments, the larger feature size wider than 1X feature, is limited to 3X to 5X.

In some embodiments, narrow trenches such as a 1X trench are filled with a a barrier layer and a metal such as is cobalt, nickel, ruthenium, tungsten, aluminum, rhodium, iridium, molybdenum or combinations thereof and wide trenches such as power lines are filled with a second metal different than the first metal such as copper, copper manganese, or aluminum copper alloy and the like and may have a barrier layer between the second metal and a dielectric layer.

Figure 5:
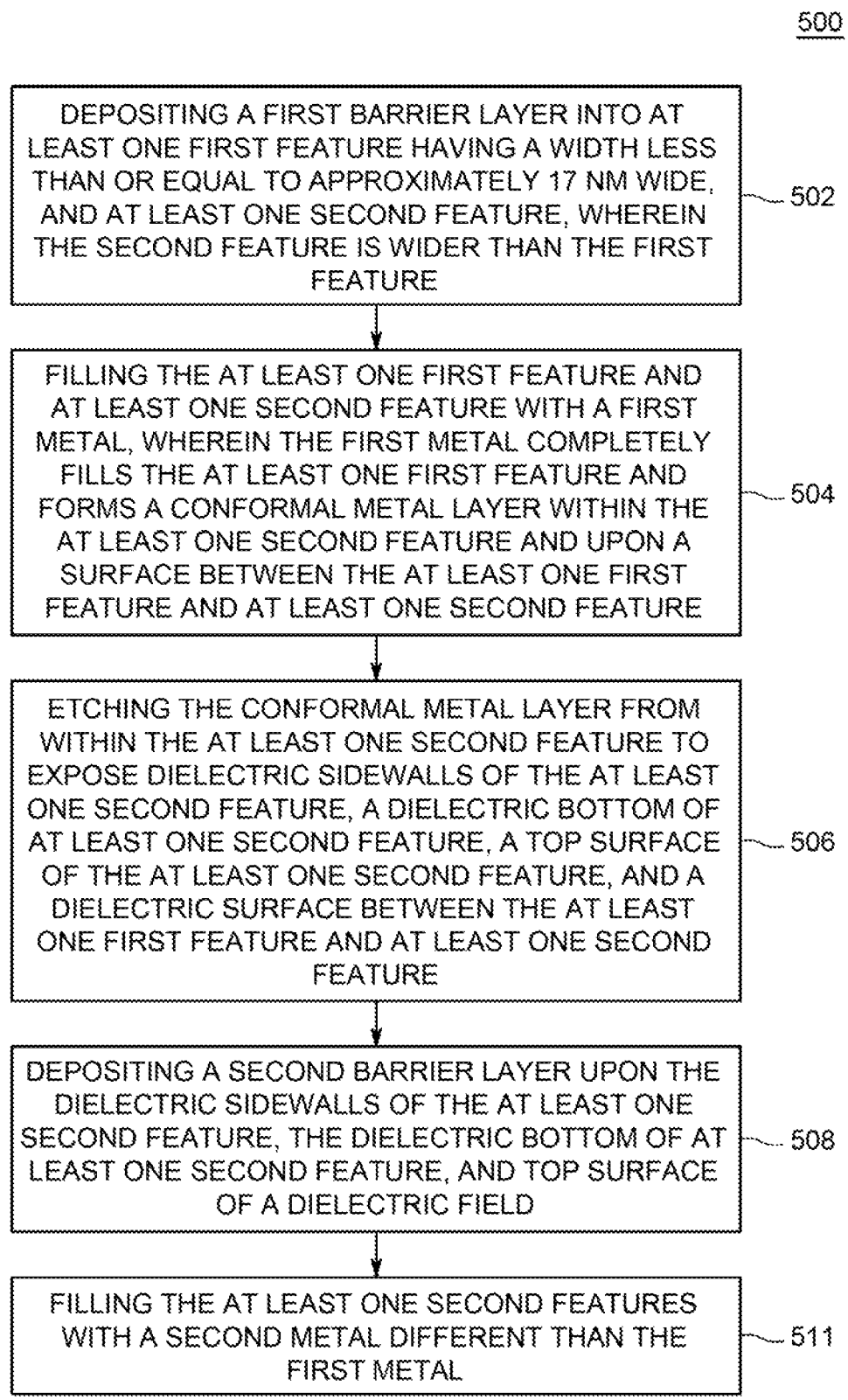
FIG. 5 illustrates a method of forming an interconnect according to one embodiment of the present disclosure.

FIG. 5 illustrates a method 500 of forming an interconnect according to one embodiment of the present disclosure. The method 500 is described below with respect to the stages of processing a substrate as depicted in FIGS. 6A-6G which illustrate cross-sectional views of the substrate prior to, and at different stages of the method 500 of FIG. 5 and may be performed, for example, in a suitable reactor, such as is described above with respect to FIG. 4. Exemplary processing systems that may be used to perform the methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

FIG. 6A illustrates a cross-sectional view of an interconnect 600 prior to commencement of method 500. Generally, the interconnect 600 includes multiple film layers that may be utilized to form an interconnect structure, such as a dual damascene structure. In embodiments, a film stack as described above is provided having a metal filled via in accordance with the present disclosure and a trench disposed thereon. In embodiments, FIG. 2G embodiments, including one or more narrow trench features below 19 nm and one or more wide trench features such as 2X to 5X features are provided and suitable for filling in accordance with the present disclosure. In embodiments, at process sequence 502, and FIG. 6B, a first barrier layer 520 is deposited into at least one first feature such as a trench 512 having a width less than or equal to approximately 17 nm wide, and at least one second feature such as second trench 512', wherein the second feature such as trench 512' is wider than the first feature such as trench 512. In embodiments, the first barrier layer 520 includes the same materials as the second barrier layer 270 described above. In some embodiments, first barrier layer 520 may be deposited upon the dielectric sidewalls 517, field 515, and the dielectric bottom 519 of the trench 512 and trench 512'. In embodiments, trench 512 may be covered with one or more barrier layers such as a first barrier layer 520. For example, the sidewall(s) of the trench such as dielectric sidewalls 517, the bottom surface such as dielectric bottom 519 of trench 512 and trench 512' may be covered by a first barrier layer 520. The first barrier layer 520 may serve to prevent diffusion of a subsequently deposited metal into underlying layers, such as dielectric layer 510. The first barrier layer 520 may include any material suitable to act as a barrier. For example, in some embodiments, the first barrier layer 520 may include a metal nitride, such as titanium nitride (TiN), tantalum nitride (TaN), tungsten nitride (WN), or the like. The first barrier layer 520 may have any thickness suitable to prevent the diffusion of subsequently deposited metal layer materials into underlying layers. For example, in some embodiments, the first barrier layer 520 layer may have a thickness of about 5 to about 20 angstroms, or 5 to 15 angstroms. The first barrier layer 520 may be formed by any process suitable to provide the first barrier layer 520 having a suitable thickness. For example, in some embodiments, the first barrier layer 520 may be formed via a deposition process, such as chemical vapor deposition, physical vapor deposition, or a cyclical deposition process, for example, such as atomic layer deposition, or the like. In embodiments, the first barrier layer 520 comprises one of more layers of TaN deposited by atomic layer deposition (ALD) process. In embodiments, an ALD process may deposit TaN to form first barrier layer 520, or one or more layers of first barrier layer 520 to a thickness sufficient to function as a barrier layer. In embodiments, first barrier layer 520 comprises a layer of material conformally deposited atop the internal trench surfaces. In embodiments, the first barrier layer may comprise or consist of an adhesion layer or nucleation layer in a thickness sufficient to maintain metal deposited therein. In some embodiments, it should be understood that the first barrier layer in a trench may be the same as the second barrier layer described in the embodiment of FIG. 2G.

Referring now to FIG. 6C, an optional liner layer 540 may be conformally deposited atop first barrier layer 520. In some embodiments, a liner layer 540 may optionally be deposited upon the first barrier layer 520. For example, the dielectric sidewalls 517, field 515, and the dielectric bottom 519 of the trench 512 and trench 512' may be covered by a liner layer 540. In embodiments, the liner layer 540 is disposed directly atop first barrier layer 520. In some embodiments, the liner layer 540 may serve to prevent diffusion of a subsequently deposited metal into underlying layers, such as dielectric layer 510. In embodiments, the liner layer 540 may include any material suitable to act as a barrier. For example, in some embodiments, the liner layer 540 may include a metal, for example, titanium (Ti), tantalum (Ta), cobalt (Co) such as CVD deposited cobalt), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The liner layer 540 may have any thickness suitable to prevent the diffusion of subsequently deposited metal layer materials into underlying layers. For example, in some embodiments, the liner layer 540 layer may have a thickness of about 10 to about 20 angstroms, or 10 to 15 angstroms. The liner layer 540 may be formed by any process suitable to provide the liner layer 540 having a suitable thickness. For example, in some embodiments, the liner layer 540 may be formed via a deposition process, such as chemical vapor deposition, physical vapor deposition, or a cyclical deposition process, for example, such as atomic layer deposition, or the like. In embodiments, the liner layer 540 comprises one of more layers of TaN deposited by atomic layer deposition (ALD) process. In embodiments, an ALD process may deposit TaN to form liner layer 540, or one or more layers of liner layer 540 to a thickness sufficient to function as a liner layer. In embodiments, liner layer 540 comprises a layer of material conformally deposited atop the internal trench 512 without completely filling the trench 512 and atop the internal trench 512' with completely filling the trench 512'.

Referring now to FIG. 5 at block 504 and FIG. 6D, method 500 includes, filling the at least one first feature such as trench 512 and at least one second feature such as trench 512' with a first metal 513, wherein the first metal 513 completely fills the at least one first feature such as trench 512 and forms a conformal metal layer 560 within the at least one second feature such as trench 512' and upon a surface such as field 570 between the at least one first feature such as trench 512 and at least one second feature such as trench 512'. In embodiments, first metal 513 non-selectively fills the trench 512, as illustrated in FIG. 6D. For example, a first metal 513 material is deposited in the trench 512 up to a point above the field 570. The first metal 513 used may be any suitable metal material such as cobalt (Co), nickel (Ni), ruthenium (Ru), tungsten (W), aluminum (Al), rhodium (Rh), iridium (Ir), molybdenum (Mo), or the like. In some embodiments, first metal 513 is a different material as the subsequent metal such as copper deposited in the trench 512'. In some embodiments, the first metal in first trench such as trench 512 is the same as the first metal used in second trench such as trench 512'. For example, in embodiments, first metal in trench 512 is cobalt, and the first metal in trench 512' is cobalt. In some embodiments, the first metal in first trench such as trench 512 is different than the first metal used in second trench such as trench 512'. For example, in embodiments, first metal in trench 512 is cobalt (Co), nickel (Ni), ruthenium (Ru), tungsten (W), aluminum (Al), rhodium (Rh), iridium (Ir), molybdenum (Mo), or the like, or combinations thereof, and the first metal in trench 512' is copper, copper manganese, or aluminum copper alloy, or combinations thereof.

In some embodiments, at least one first feature such as trench 512 is narrower than the at least one second feature such as trench 512'. For example trench 512' may be wider than trench 512 such as 2 to 5 times wider. In some embodiments, a sufficient amount of first metal 513 is deposited, such that the first metal 513 fills or completely fills the at least one first feature such as trench 512 and forms a conformal metal layer 560 within the at least one second feature such as trench 512'.

Referring now to FIG. 5 at block 506 and FIG. 6E, method 500 includes etching the conformal metal layer 560 from within the at least one second feature such as trench 512' to expose dielectric sidewalls 517 of the at least one second feature such as trench 512', a dielectric bottom 519 of at least one second feature such as trench 512', a top surface of the at least one second feature, and a dielectric surface or field 570 between the at least one first feature such as trench 512 and at least one second feature such as trench 512'. In some embodiments, etching the conformal metal layer 560 within the trench 512' to expose dielectric sidewalls 517 of the trench 512' comprises removing the first barrier layer 520, and if present the liner layer 540 within the trench. In some embodiments, etching comprises atomic layer etching. In embodiments, portions of conformal metal layer 560 may be removed by a cyclic atomic layer etching process in an atomic layer etch (ALE) chamber. In embodiments the etching is one directional such as in the direction of arrow 580 to focus removal of the portions of conformal metal layer 560, first barrier layer or first liner layer described above. In embodiments, atomic layer etching may include a directional plasma application (oxygen, hydrogen, chlorine, or other halides) to modify metal in direct view or perpendicular to arrow 580. The ALE process may include treating the surface, etching the surface, annealing the surface, and repeating the sequence until an amount of metal material from conformal metal layer 560 is removed to expose the dielectric sidewalls 517 of the trench, a top surface or field 570, and a dielectric bottom 519 of the trench 512'. In embodiments, the etch stop is on the dielectric bottom 519 of the trench 512' which may be a low-k dielectric layer. In some embodiments, etching comprises removing a first metal such as cobalt (Co), nickel (Ni), ruthenium (Ru), tungsten (W), aluminum (Al), rhodium (Rh), iridium (Ir), molybdenum (Mo), or the like from a trench 512', and sidewalls of a trench, wherein the first metal 513 such as cobalt (Co), nickel (Ni), ruthenium (Ru), tungsten (W), aluminum (Al), rhodium (Rh), iridium (Ir), molybdenum (Mo), or the like stays within the one or more trenches 512. In embodiments, the ALE process is performed in a chamber such as shown in FIG. 3 or integrated system shown in FIG. 4.

Referring now to FIG. 5 at block 508 and FIG. 6F, method 500 includes depositing a second barrier layer 521 upon the dielectric sidewalls 517 of the at least one second feature such as trench 512', the dielectric bottom 519 of at least one second feature such as trench 512', and top surface of a dielectric field such as field 570. In embodiments, the second barrier layer 521 is the same material as first barrier layer 520. In embodiments, the second barrier layer 521 is deposited in the same manner and amounts as first barrier layer 520. In embodiments, a second liner (not shown in FIG. 6F) material may optionally be deposited atop the first barrier layer 520.

Referring now to FIG. 5 at block 511 and FIG. 6G, method 500 includes filling the at least one second features such as trench 512' with a second metal different than the first metal such as the first metal in trench 512. In some embodiments, the first metal in first trench such as trench 512 is different than the first metal used in second trench such as trench 512'. For example, in embodiments, first metal in trench 512 is cobalt, nickel, ruthenium, tungsten, aluminum, rhodium, iridium, molybdenum or combinations thereof, and the first metal in trench 512' is copper, copper manganese, or aluminum copper alloy, or combinations thereof. In embodiments, trench 512' is characterized as a 2X to 5X trench, compared to trench 512, characterized as a 1X trench.

In some embodiments, the present disclosure relates to a method of forming an interconnect, including: depositing a first barrier layer into at least one first feature having a width less than or equal to approximately 17 nm wide, and at least one second feature, wherein the second feature is wider than the first feature; filling the at least one first feature and at least one second feature with a first metal, wherein the first metal completely fills the at least one first feature and forms a conformal metal layer within the at least one second feature and upon a surface between the at least one first feature and at least one second feature; etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature; depositing a second barrier layer upon the dielectric sidewalls of the at least one second feature, the dielectric bottom of at least one second feature, and top surface of a dielectric field; and filling the at least one second features with a second metal different than the first metal.

In some embodiments, an integrated system includes a plurality of reaction chambers configured for: depositing a first barrier layer into at least one first feature having a width less than or equal to approximately 17 nm wide, and at least one second feature, wherein the second feature is wider than the first feature; filling the at least one first feature and at least one second feature with a first metal, wherein the first metal completely fills the at least one first feature and forms a conformal metal layer within the at least one second feature and upon a surface between the at least one first feature and at least one second feature; etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature; depositing a second barrier layer upon the dielectric sidewalls of the at least one second feature, the dielectric bottom of at least one second feature, and top surface of a dielectric field; and filling the at least one second features with a second metal different than the first metal.

In some embodiments, the integrated tool may be equipped with a processor including memory stored thereon. In embodiments, a computer readable medium, having instructions stored thereon which, when executed, cause an integrated system to perform a method of forming an interconnect, including: depositing a first barrier layer into at least one first feature having a width less than or equal to approximately 17 nm wide, and at least one second feature, wherein the second feature is wider than the first feature; filling the at least one first feature and at least one second feature with a first metal, wherein the first metal completely fills the at least one first feature and forms a conformal metal layer within the at least one second feature and upon a surface between the at least one first feature and at least one second feature; etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature; depositing a second barrier layer upon the dielectric sidewalls of the at least one second feature, the dielectric bottom of at least one second feature, and top surface of a dielectric field; and filling the at least one second features with a second metal different than the first metal.

In some embodiments, the present disclosure relates to a method of forming an interconnect, including: depositing a first barrier layer into at least one first feature having a width less than or equal to approximately 17 nm wide, and at least one second feature, wherein the second feature is wider than the first feature; filling the at least one first feature and at least one second feature with a first metal, wherein the first metal fills or completely fills the at least one first feature and forms a conformal metal layer within the at least one second feature and upon a surface between the at least one first feature and at least one second feature; etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature; depositing a second barrier layer upon the dielectric sidewalls of the at least one second feature, the dielectric bottom of at least one second feature, and top surface of a dielectric field; and filling the at least one second features with a second metal different than the first metal. In some embodiments, the at least one first feature or at least one second feature is a trench. In some embodiments, the first metal includes one or more of copper (Cu) cobalt (Co), nickel (Ni), ruthenium (Ru), tungsten (W), aluminum (Al), rhodium (Rh), iridium (Ir), molybdenum (Mo), or combinations thereof. In some embodiments, the second metal includes one or more of copper (Cu) cobalt (Co), nickel (Ni), ruthenium (Ru), tungsten (W), aluminum (Al), rhodium (Rh), iridium (Ir), molybdenum (Mo), or combinations thereof. In some embodiments, etching includes atomic layer etching.

While the foregoing is directed to embodiments of the present disclosure, other and further embodiments of the disclosure may be devised without departing from the basic scope thereof.

The invention claimed is:

1. A method of forming an interconnect, comprising:
depositing a first barrier layer upon a top surface of a via and a top surface of a trench;
filling the via with a first metal, wherein the first metal completely fills the via and forms a metal layer within the trench;
etching the metal layer within the trench to expose dielectric sidewalls of the trench, a top surface of the via, and a dielectric bottom of the trench;
depositing a second barrier layer upon the dielectric sidewalls, top surface of the via, and the dielectric bottom of the trench; and
filling the trench with a second metal different than the first metal.

2. The method of claim 1, wherein the via and the trench are joined in a film stack.

3. The method of claim 1, further comprising depositing a first liner layer on the first barrier layer.

4. The method of claim 1, further comprising depositing a second liner layer on the second barrier layer.

5. The method of claim 1, wherein etching the metal layer within the trench to expose dielectric sidewalls of the trench comprises removing the first barrier layer within the trench.

6. The method of claim 1, further comprising cleaning the trench after etching.

7. The method of claim 1, wherein etching comprises atomic layer etching.

8. The method of claim 1, wherein the first barrier layer is titanium nitride (TiN), tantalum nitride (TaN), or combinations thereof.

9. The method of claim 1, wherein the first metal is cobalt (Co), nickel (Ni), ruthenium (Ru), tungsten (W), aluminum (Al), rhodium (Rh), iridium (Ir), molybdenum (Mo), or combinations thereof.

10. The method of claim 1, wherein the second metal is copper.

11. The method of claim 1, wherein the second barrier layer is a material suitable for preventing a diffusion of copper out of the trench.

12. The method of claim 1, further comprising planarizing a top of the second metal.

13. The method of claim 1, wherein a capping layer is disposed atop the second metal.

14. A method of forming an interconnect, comprising:
depositing a first barrier layer into at least one first feature having a width less than or equal to approximately 17 nm wide, and at least one second feature, wherein the second feature is wider than the first feature;
filling the at least one first feature and at least one second feature with a first metal, wherein the first metal completely fills the at least one first feature and forms a conformal metal layer within the at least one second feature and upon a surface between the at least one first feature and at least one second feature;
etching the conformal metal layer from within the at least one second feature to expose dielectric sidewalls of the at least one second feature, a dielectric bottom of at least one second feature, a top surface of the at least one second feature, and a dielectric surface between the at least one first feature and at least one second feature;
depositing a second barrier layer upon the dielectric sidewalls of the at least one second feature, the dielectric bottom of at least one second feature, and top surface of a dielectric field; and
filling the at least one second features with a second metal different than the first metal.

15. The method of claim 14, wherein the at least one first feature or at least one second feature is a trench.

16. The method of claim 14, wherein the first metal comprises one or more of copper (Cu) cobalt (Co), nickel (Ni), ruthenium (Ru), tungsten (W), aluminum (Al), rhodium (Rh), iridium (Ir), molybdenum (Mo), or combinations thereof.

17. The method of claim 14, wherein the second metal comprises one or more of copper (Cu) cobalt (Co), nickel (Ni), ruthenium (Ru), tungsten (W), aluminum (Al), rhodium (Rh), iridium (Ir), molybdenum (Mo), or combinations thereof.

18. The method of claim 14, wherein etching comprises atomic layer etching.

19. An integrated system comprising:
a plurality of reaction chambers configured for:
depositing a first barrier layer upon a top surface of a via and a top surface of a trench;
filling the via with a first metal, wherein the first metal completely fills the via and forms a metal layer within the trench;
etching the metal layer within the trench to expose dielectric sidewalls of the trench, a top surface of a via, and a dielectric bottom of the trench;
depositing a second barrier layer upon the dielectric sidewalls, top surface of the via, and the dielectric bottom of the trench; and
filling the trench with a second metal different than the first metal.

20. The integrated system of claim 19, further comprising:
a vacuum substrate transfer chamber,
an atomic layer etching chamber, wherein the atomic layer etching chamber is coupled to the vacuum substrate transfer chamber; and wherein the atomic layer etching chamber is configured for expose dielectric sidewalls of the trench, a top surface of a via, and a dielectric bottom of the trench; and
at least one additional chamber for substrate processing, wherein the integrated system is configured to move a substrate from the atomic layer etching chamber to the at least one additional chamber under vacuum.

* * * * *